(12) United States Patent  
Baur et al.

(10) Patent No.: US 10,141,483 B2  
(45) Date of Patent: Nov. 27, 2018

(54) SEMICONDUCTOR ILLUMINATING DEVICE

(71) Applicant: OSRAM Opto Semiconductors GmbH, Regensburg (DE)

(72) Inventors: Elmar Baur, Regensburg (DE); Reiner Windisch, Pettendorf (DE); Frank Baumann, Lörrach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/549,364

(22) PCT Filed: Jan. 11, 2016

(86) PCT No.: PCT/EP2016/050378  
§ 371 (c)(1),  
(2) Date: Aug. 7, 2017

(87) PCT Pub. No.: WO2016/124357  
PCT Pub. Date: Aug. 11, 2016

(65) Prior Publication Data  
US 2018/0033921 A1 Feb. 1, 2018

(30) Foreign Application Priority Data  
Feb. 6, 2015 (DE) .......... 10 2015 202 159

(51) Int. Cl.  
*H01L 33/50* (2010.01)  
*C09K 11/08* (2006.01)  
(Continued)

(52) U.S. Cl.  
CPC ........ *H01L 33/504* (2013.01); *C09K 11/0883* (2013.01); *C09K 11/646* (2013.01);  
(Continued)

(58) Field of Classification Search  
CPC ..... C09K 11/0883; C09K 11/646; F21K 9/23; H01L 25/0753; H01L 33/504; H01L 33/507  
(Continued)

(56) References Cited

U.S. PATENT DOCUMENTS 7,847,303 B2 * 12/2010 Jung ................. H01L 25/0753  
                                                  257/89  
9,231,170 B2 * 1/2016 Windisch ............... H01L 27/15  
(Continued)

FOREIGN PATENT DOCUMENTS

DE     102012217731 A1    5/2013  
JP      2006049799 A      2/2006  
(Continued)

OTHER PUBLICATIONS

"Detailed Data Sheet, XIM and XIM Generation 4 LED Modules with Corrected Cold Phosphor Technology, Vibrant Series, V80," Xicato, www.xicato.com, Apr. 26, 2017, 21 pages.  
(Continued)

*Primary Examiner* — Seung Lee  
(74) *Attorney, Agent, or Firm* — Slater Matsil, LLP

(57) ABSTRACT

A semiconductor illuminating device is disclosed. The device includes an LED configured for emitting blue primary radiation and an LED phosphor arranged and configured such that it emits secondary light that forms at least one component of the illumination light, wherein the LED phosphor comprises a red phosphor for emitting red light as a component of the secondary light and a green phosphor for emitting green light as a component of the secondary light, wherein the green light has a color point located above a first straight line having a slope $m_1$ and a y-intercept $n_1$ in a CIE standard chromaticity diagram, with the slope $m_1=1.189$ and the y-intercept $n_1=0.226$, and wherein the components of the  
(Continued)

illumination light are at such a ratio to one another that the illumination light has a color temperature of at most 5500 K.

18 Claims, 3 Drawing Sheets

(51) Int. Cl.
    *C09K 11/77*     (2006.01)
    *C09K 11/64*     (2006.01)
    *F21K 9/23*     (2016.01)
    *H01L 25/075*     (2006.01)

(52) U.S. Cl.
    CPC .......... *C09K 11/7734* (2013.01); *H01L 33/50* (2013.01); *H01L 33/507* (2013.01); *F21K 9/23* (2016.08); *H01L 25/0753* (2013.01); *H01L 2224/48091* (2013.01); *H01L 2224/48137* (2013.01); *H01L 2924/181* (2013.01)

(58) Field of Classification Search
    USPC ........................................................ 362/368
    See application file for complete search history.

(56) References Cited

U.S. PATENT DOCUMENTS

| | | | |
|---|---|---|---|
| 9,322,529 | B2 | 4/2016 | Yoshimura et al. |
| 9,559,272 | B2* | 1/2017 | Ouderkirk .......... H01L 25/0753 |
| 9,719,013 | B2 | 8/2017 | Fiedler et al. |
| 2008/0180948 | A1 | 7/2008 | Yoon et al. |
| 2011/0309325 | A1 | 12/2011 | Park et al. |
| 2012/0008065 | A1 | 1/2012 | Im et al. |
| 2012/0104935 | A1* | 5/2012 | Haase .................. H01L 33/504 313/499 |
| 2012/0243240 | A1* | 9/2012 | Hashimoto .......... F21V 23/006 362/368 |
| 2012/0274240 | A1 | 11/2012 | Lee et al. |
| 2013/0258211 | A1 | 10/2013 | Yoo et al. |
| 2014/0055982 | A1 | 2/2014 | Tao et al. |
| 2014/0312760 | A1 | 10/2014 | Augustine |
| 2014/0376205 | A1 | 12/2014 | Takizawa |
| 2015/0276198 | A1 | 10/2015 | Hata et al. |

FOREIGN PATENT DOCUMENTS

| | | |
|---|---|---|
| JP | 2008166825 A | 7/2008 |
| JP | 2008285576 A | 11/2008 |
| JP | 2012246462 A | 12/2012 |
| WO | 2013136732 A1 | 9/2013 |
| WO | 2014061555 A1 | 4/2014 |
| WO | 2015052238 A1 | 4/2015 |

OTHER PUBLICATIONS

Hashimoto, K. et al., "A New Method for Specifying Color Rendering Properties of Light Sources Based on Feeling of Contrast," Publication in Color Research and Application Issue #5, 2007, 27 pages.

"Introducing Xicato's Vibrant Series," downloaded from http://www.xicato.com/sites/default/tiles/documents/Introducing_the_Vibrant_Series.pdf, Aug. 23, 2017, 22 pages.

"TALEXXmodule STARK-SLE GEN3 Fashion, STARK SLE," LED Light Engine/OLED LED Compact, Tridonic, www.tridonic.com, Jul. 2014, 10 pages.

* cited by examiner

SEMICONDUCTOR ILLUMINATING DEVICE

This patent application is a national phase filing under section 371 of PCT/EP2016/050378, filed Jan. 11, 2016, which claims the priority of German patent application 10 2015 202 159.9, filed Feb. 6, 2015, each of which is incorporated herein by reference in its entirety.

TECHNICAL FIELD

The present invention relates to a semiconductor illuminating device for emitting illumination light.

BACKGROUND

An LED-based light source can provide advantages in terms of energy efficiency compared to a conventional light bulb, for example. However, in such semiconductor illuminating devices, one challenge may consist in achieving good color rendering indices, for example. The reference to be approached, as far as possible, is a halogen light source as a black body, in any case up to a color temperature of 5000 K. Thus, the spectrum of the LED-based light source is compared to that of the halogen light source for various test colors, with high "light quality" considered to be approaching the halogen light source as far as possible, which is expressed by color rendering indices of ≥90, for example.

SUMMARY OF THE INVENTION

Embodiments of the invention provide a particularly advantageous semiconductor illuminating device.

Further embodiments provide a semiconductor illuminating device for emitting illumination light comprising an LED, which is configured for emitting blue primary radiation, an LED phosphor, which is arranged and configured such that it is excited by the primary radiation in operation and consequently emits secondary light that forms at least one component of the illumination light, wherein the LED phosphor comprises a red phosphor for emitting red light as a component of the secondary light and a green phosphor for emitting green light as a component of the secondary light, which green light has a color point located above a first straight line having a slope $m_1$ and a y-intercept $n_1$ in a CIE standard chromaticity diagram, with the slope $m_1=1.189$ and the y-intercept $n_1=0.226$, and wherein the components of the illumination light are at such a ratio to one another that the illumination light has a color temperature of at most 5500 K.

Other embodiments are indicated in the dependent claims and the entire disclosure, with the description of the invention not always discriminating in detail between aspects of the device and aspects of the use or method; anyway, implicitly, the disclosure is to be understood regarding all claim categories.

White light as illumination light thus results from a corresponding mix of red, green and blue light, wherein the latter can generally also be emitted by a blue phosphor, but preferably is equal to that of the primary radiation emitted by the LED. Here, according to the invention, the green phosphor is selected such that the color point of the green light in a CIE standard chromaticity diagram (CIE standard chromaticity diagram 1931, in the entire disclosure) is located above the straight line y=1.189·x+0.226, cf. FIG. 3 for illustration. To put it simply, the color point of the green light shall have a significant distance to the red, which results in a comparably pronounced minimum between the green and red component, cf. FIG. 1 for illustration.

The inventors have found that in an illumination with the corresponding illumination light, red and green shades are more saturated, which often is perceived as being pleasant. A somewhat figurative and simplified explanatory approach is that many dyes (which are illuminated with the illumination light in question) are comparably broadband in the reflection of the light of "their" color, which in the end may result in a slight "washed-out" impression of the actual color; by creating a certain gap between the red and the green component of the illumination light, a part of the broadband reflection is cut-off and the corresponding illuminated (red or green) dye appears more saturated. Then again, this however needs not necessarily result in a worse color rendering of yellow shades, because the color stimulus "yellow" can be set sufficiently well for the human eye by additive color mixture of red and green.

In the spectrum of the entire light emitted by the illuminating device, there is thus a minimum (generally a local minimum) in the yellow, i.e., between 550 nm and 600 nm, for example, preferably between 560 nm and 590 nm. Here, "minimum" relates to a value which is smaller by at least 5%, preferably at least 10%, than each of the two closest neighboring maxima (e.g., a measurement noise shall not be taken into account).

An approach of the inventors alternative to the present concept, namely to the selection of the green phosphor having the already originally spaced color point, would have been to generate a corresponding gap in the illumination light spectrum by filtering. However, this would have meant a loss in efficiency because part of the light generated would have remained unused. The presently preferred green phosphors having an originally suitable color point (see below in detail) may also have a lower efficiency compared to the common green phosphors, such as a garnet, which is why use of the latter appears more advantageous in direct comparison. The "spectral finishing" by filtering, however, would consume this initial advantage in efficiency. Therefore, according to the invention, a green phosphor having an originally suitable color point is selected.

The reference to "light" relates to radiation having at least one component in the visible spectral range (380 nm to 780 nm); "radiation" refers to electromagnetic radiation. In general, the primary radiation emitted by the LED can also be located in the ultraviolet and excite a blue phosphor, preferably however, it is blue light. In other words, blue light as a (further) component of the illumination light, which is based on the primary radiation, preferably is equal to this radiation, is mixed to the red and green light.

As far as "component" of the secondary light or of the illumination light is mentioned, this means light which has intensities in a spectral sub-range of the respective light (secondary light or illumination light) and thus at least co-determines the spectral characteristic (of the secondary light or illumination light) in the respective sub-range. The components will usually overlap, but preferably there is a range for each component in which only this component has intensities.

The illumination light has a color temperature of at most 5500 K, with at most 5000 K, 4500 K or 4000 K in the specified order being further preferred upper limits. Preferred lower limits are at, e.g., at least 2500 K, 2600 K or 2700 K, also further preferred in the specified order. The color point of the "white" illumination light needs not necessarily be located exactly on the Planckian curve, a certain offset may even be preferred (see below in detail).

The color points of the same color temperature are located on the so-called Judd straight lines then, which in each case extend obliquely to the Planckian curve (per color temperature).

In general, the "LED" (light emitting diode) can either be a housed LED or an LED chip. The red and the green phosphor are preferably provided in a mix, particularly preferably both embedded together in a filler material, particularly preferably both embedded together in a filler material covering the LED chip. The filler material may be applied by casting, for example, e.g., as a silicone cast.

In a preferred embodiment, the color point of the illumination light in the CIE standard chromaticity diagram is in a range that limits the Planckian curve upward and extends downward to a distance of 15 threshold value units from the Planckian curve, with 14, 13, 12, 11 or 10 threshold value units being further preferred limits of the range in the specified order. A threshold value unit (SWE) is defined as $SWE=((u'_1-u'_1)^2 \cdot (v'_2-v'_1)^2)^{1/2}$, namely in the normalized u'(v') space, which results from transformation from the $c_x/c_y$ space (CIE standard chromaticity system). Regarding a lateral limit of the ranges, reference is made to above-mentioned preferred color temperatures.

In a configuration, the color point of the green light in the CIE standard chromaticity diagram is additionally above a second straight line of the form $y=-0.833 \cdot x+0.692$. For illustration, reference is made again to FIG. 3. In general, "located above a straight line" means that a corresponding color point has a y-value equal to or greater than the y-value resulting from x-value of the color point using the equation of the corresponding straight line, and preferably it is greater.

In an embodiment, the color point of the green light in the CIE standard chromaticity diagram is in a rectangle spanned by four (x/y)-value pairs, wherein the (x/y)-value pairs are: (0.352/0.645), (0.25/0.73), (0.17/0.55) and (0.23/0.5). In each case first the x value and then the y value is indicated per value pair, i.e., per bracket. The rectangle has straight side edges, the value pairs define the corners. The specified order of the value pairs corresponds to the counter-clockwise order of the corners. The color point of the green light shall be located within the rectangle, which in general also means on the lateral edges, but preferably at a distance to them.

In a configuration, the green light has a dominant wavelength $\lambda_{Dom}$ of at least 515 nm, in this order increasingly preferred at least 520 nm, 525 nm, 530 nm or 535 nm. The dominant wavelength $\lambda_{Dom}$ of the green light shall be located preferably at at most 555 nm, wherein at most 552.5 nm is further preferred, and at most 550 nm is particularly preferred. The full width at half maximum of the green light shall be located preferably at at most 85 nm, wherein at most 82.5 nm is further preferred, and at most 80 nm is particularly preferred. Possible lower limits of the full at width half maximum can be located at, e.g., at least 30 nm, 40 nm, 50 nm or 60 nm.

In general, the specifications "dominant wavelength $\lambda_{Dom}$" and "full width at half maximum" can also be of interest independently of one another and also shall be disclosed in this form; just as well, the upper and lower limits can in each case be of interest independent of one another and shall also be disclosed in this form. The dominant wavelength $\lambda_{Dom}$ in the CIE standard chromaticity system is the interception point of the spectral color line with a straight line, which extends through the white point and the color point of the respective examined light (color point and white point are located on the straight line).

As far as reference is made to the "color point" of light in the context this disclosure, this refers to the color point of the underlying phosphor(s) at the concentration present in the LED phosphor. The color point indicated preferably relates to a measurement on a powder, not to a measurement with the single grain; reference is made to FIG. 3 and the associated description regarding possible differences.

In a configuration, the color point of the red light in the CIE standard chromaticity system is located in a rectangle (having straight edges, cf. also the other above-mentioned information regarding the green light) spanned by four (x/y)-value pairs, wherein the (x/y)-value pairs are: (0.68/0.325), (0.61/0.39), (0.6/0.38) and (0.67/0.315). Reference is explicitly made to the above-mentioned information on the color point of the green light, which apply analogously.

In an embodiment, the red light has a peak wavelength $\lambda_{peak}$ of at least 630 nm, wherein at least 635 nm is further preferred, and 638 nm is particularly preferred. The peak wavelength $\lambda_{peak}$ of the red light shall be located preferably at at most 645 nm, wherein at most 643 nm is further preferred, and at most 641 nm is particularly preferred. The full width at half maximum of the red light shall be located preferably at at most 100 nm, with at most 95 nm, 90 nm or 85 nm being further preferred upper limits in the specified order. Possible lower limits can be at, e.g., at least 30 nm, 40 nm, 50 nm, 60 nm or 70 nm. Here, peak wavelength $\lambda_{peak}$ and full width half maximum may generally also be of interest independently of one another, which is also true for the upper and lower limits.

The inventors have found that a minimum between green and red can be achieved by a corresponding limitation of the peak wavelength, and the gap does not become too large on the other hand. The inventors have found a good color saturation in this range (due to the gap), with at the same time still a good color rendering because the gap is simply not too large.

In a configuration, the color rendering index $R_a$ (CRI), calculated according to CIE 13.2, of the illumination light is at at least 80, 81, 82, 83 84 or 85, increasingly preferred in the specified order; possible upper limits can be at, e.g., at most 95 or 90.

In an embodiment, the red light has a dominant wavelength $\lambda_{Dom}$ of at least 595 nm, wherein a dominant wavelength $\lambda_{Dom}$ of at least 597.5 nm is further preferred and at least 600 nm is particularly preferred. The dominant wavelength $\lambda_{Dom}$ of the red light shall be located at preferably at most 620 nm, wherein at most 619 nm is further preferred and at most 618 nm is particularly preferred.

In a configuration, the green phosphor comprises at least one of a orthosilicate phosphor, nitride-orthosilicate phosphor and/or β-SiAlON phosphor (in general, e.g., an organic phosphor or also quantum dots could be provided as green phosphor). Preferably, the green phosphor comprises only one thereof, particularly preferably it consists exclusively of one thereof, namely the green phosphor is a single phosphor (which is preferred in general). In general, the green phosphor could also be a mix of multiple single phosphors.

The green phosphor (orthosilicate phosphor, nitride-orthosilicate phosphor) can, e.g., be of the form $AE_{2-x-a}RE_xEU_aSi_{1-y}O_{4-x}N_x$ (AE=Sr, Ba, Ca, Mg; RE=rare earth element) and/or $AE_{2-x-a}RE_xEU_aSi_{1-y}O_{4-x-2y}N_x$ (AE=Sr, Ba, Ca, Mg; RE=rare earth element).

In other words, molecular formula for the green phosphor can be $AE_{2-x}L_xSiO_{4-x}N_x$:RE and/or $AE_{2-x}L_xSi_{1-y}O_{4-x-2y}N_x$:RE and/or $AE_2SiO_4$:RE, wherein AE contains one or more element(s) selected from Mg, Ca, Sr, Ba and RE contains one or more element(s) selected from rare earth metals, preferably at least Eu, and L contains one or more element(s) selected from rare earth metals different from RE, with $0<x\leq0.1$, preferably $0.003\leq x\leq0.02$, and $0<y\leq0.1$, preferably $0.002\leq y\leq0.02$. Particularly preferably, the phosphor contains at least Sr and Ba as AE, and the ratio of Sr and Ba is: $0.5\leq Ba:Sr\leq2$, further preferably $0.75\leq Ba:Sr\leq1.25$.

In a configuration, a $(Sr,Ca)AlSiN_3$ phosphor and/or a so-called 226-phosphor is provided as red phosphor, preferred is one of the two as single phosphor. The 226-phosphors here comprise the same crystal structure as $Sr(Sr_aCa_{1-a})Si_2Al_2N_6$. The space group of the 226-phosphor preferably is monoclinic $P2_1$. Particularly preferably, the crystal structure of the 226-phosphor comprises a unit cell twice as large as in the crystal structure of a $(Sr,Ca)AlSiN_3$ phosphor.

A 226-phosphor as red phosphor is, e.g., represented by the general molecular formula $Sr_xCa_{1-x}AlSiN_3$:Eu, wherein $0.8<x\leq1$; at a proportion of between 0.1% and 5% (in each case including), the Sr, Ca and/or Sr/Ca lattice places are substituted by Eu; in the x-ray structure analysis, the phosphor shows a reflex with the Miller indices $1\overline{2}1$ in orthorhombic description.

As already mentioned at the beginning, the primary radiation emitted by the LED in a preferred configuration is blue light, which forms a component of the illumination light. Part of the blue light has a component of the illumination light then; another part, however, is used for exciting the LED phosphor. This operation mode is also referred to as a partial conversion, the LED phosphor is radiated, for example, with the blue light, wherein actually not the entire blue light is converted. Generally, "conversion" refers to a down-conversion in the context of this disclosure, thus the secondary light has longer waves compared to the primary radiation.

The dominant wavelength $\lambda_{Dom}$ of the blue light can be located at, e.g., at least 434 nm, 436 nm, 438 nm, 440 nm, 442 nm or 444 nm, increasingly preferred in the specified order; possible upper limits are at, e.g., at most 466 nm, 464 nm, 462 nm, 460 nm, 458 nm or 456 nm (increasingly preferred in the specified order). Upper and lower limit can again be of interest independently of one another and also shall be disclosed in this form. Advantageously, a further gap can be achieved in the illumination light spectrum, namely between blue and green fractions. Consequently, the color saturation can be increased also in the blue spectral range, and that in the green spectral range can be further improved.

The LED is an LED based on a III-V semiconductor compound material, wherein a nitride semiconductor compound material is particularly preferred, e.g., $Al_nIn_{1-n-m}Ga_mN$ with $0\leq n\leq1$, $0\leq m\leq1$ and $n+m\leq1$. Here, the semiconductor layer sequence can comprise dopants and, in general, additional constituents and, for the sake of simplicity, only essential constituents are specified. Thus, an InGaN-LED is preferred.

In an embodiment, the illuminating device comprises a multitude of LEDs, e.g., at least 2, 5, 10, 15 or 20 LEDs, increasingly preferred in the specified order; possible upper limits can be at at most 300, 200 or 100 LEDs. This multitude of LEDs are housed together; thus, a corresponding multitude of LEDs (which per se are each un-housed) is housed together with a filler material, preferably casted together; silicone is preferred as a filler or casting material. Preferably, a continuous body made of the filler material is to cover the LED chips. The LED chips are preferably arranged and wired on a common substrate; substrate and filler material together encapsulate the LED chips then.

A configuration of the illuminating device relates to the FCI value of the illumination light, which as a so-called feeling of contrast index (FCI) is on the one hand a measure for the presently particularly addressed color saturation, but on the other hand takes the color rendering into account, wherein the FCI takes the feeling of the human viewer into account. For further details, reference is made to Hashimoto et al., *A new method for specifying color-rendering properties of light sources based on feeling of contrast*, Color Research and Application, Issue no. 5, 2007.

If the illumination light has a color temperature of less than 3000 K, the FCI value is to be at least 130. Basically, the FCI value can also be subject to a certain variation in the case of the same phosphor mix and depend, e.g., on the operational temperature (decrease along with an increasing temperature), cf. also FIG. 4 for illustration. This figure further illustrates that slightly different FCI values can result even with the same color temperature (i.e., for color points located on a common Judd straight line). With a color temperature less than 3000 K, the FCI preferably is to be located at at least 130.

As the FCI value decreases as the color temperature increases, with color temperatures of at least 3000 K, an FCI value is preferred which is located above a straight line $FCI=m_{FCI}T$ (in Kelvin)+$n_{FCI}$, wherein $m_{FCI}=-0.006$ und $n_{FCI}=148$. With color temperatures less than 3000 K, a possible upper limit of the FCI may be located at an FCI value of at most 150. With color temperatures of at least 3000 K, the FCI value may be located below a straight line $FCI=m_{FCI}T+n_{FCI}$ with $m_{FCI}=-0.006$ und $n_{FCI}=168$.

In case of doubt, the present FCI specifications refer to values determined in an illuminating device at an operational temperature of the phosphor of 120° C., but preferably they are also true up to an operational temperature of at most 160° C.

The invention also relates to a lighting device comprising a presently disclosed illuminating device and a base, to which the semiconductor illuminating device is functionally electrically connected, e.g., indirectly via interposed control electronics and/or driver electronics. The base is preferably compatible with a conventional lamp socket, which can be a pin base, a bayonet base, a tube base, a shell base, a plug base or an Edison base, for example.

Furthermore, the embodiments of the invention also relates to the use of a presently disclosed illuminating device or a lighting device thereof, namely for general lighting purposes, in particular for lighting of buildings, in particular for indoor lighting, in particular for lighting of sales areas, in particular walk-in sales areas such as, e.g., entire retail stores (here, an increased color saturation can provide particular advantages and be of higher interest). Preferably, a sales area with the goods and the walk-in sales room around the goods is illuminated with the same light at the same time, wherein, e.g., a portion of at least 30%, preferably at least 40%, of the light output by the illuminating device is used for lighting of the walk-in sales room.

The embodiments of the invention also relates to the use of a presently disclosed illuminating device or a lighting device thereof, wherein the secondary light, which is composed of the red and the green light, is used unfiltered for illumination. Preferably, the entire illumination light is used unfiltered. The "unfiltered" use relates to a permanent operation and is thus, e.g., effected over at least 10 s, 30 s, 60 s or significantly longer, e.g., at least 30 min. or 60 min. Insofar, "unfiltered" means that the entire secondary light/illumination light generated over a corresponding time is used for the lighting (apart from inevitable scattering loss).

The luminous flux which is output by the illuminating device can be at, e.g., at least 500 lm, 1000 lm, 1500 lm, 2000 lm or 2500 lm (increasingly preferred in the specified order); possible upper limits can be at, e.g., at most 10000 lm or at most 5000 lm. An efficiency of at least 50 W/lm, preferably at least 80 W/lm, particularly preferably at least 100 W/lm, can be achieved, for example; possible upper limits can be at, e.g., at most 200 W/lm or at most 150 W/lm. This is explicitly also disclosed with regard to the device category.

BRIEF DESCRIPTION OF THE DRAWINGS

Hereinafter, the invention is explained in detail using an exemplary embodiment, wherein the individual features can be invention-relevant in other combinations in the scope of the dependent claims and shall be disclosed in this form.

The Figures show in

DETAILED DESCRIPTION OF ILLUSTRATIVE EMBODIMENTS

Figure 1:
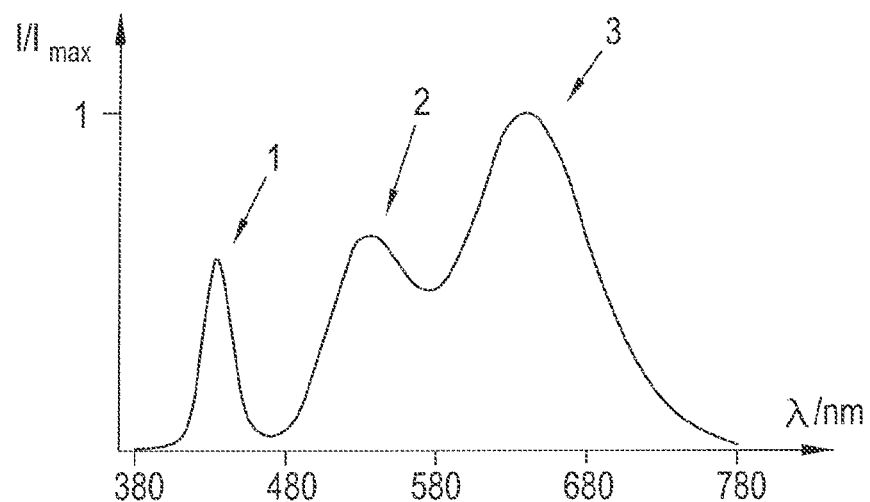
FIG. 1 is the spectral characteristic of the illumination light of an illuminating device according to the invention.

FIG. 1 shows a spectrum of the illumination light of an illuminating device according to the invention. The blue light emitted by the InGaN-LED forms a blue component 1 of the illumination light. The dominant wavelength $\lambda_{Dom}$ of the blue light is located at about 450 nm. Part of the blue LED light is thus used directly for illumination as a part of the illumination light; on the other hand, another part of the blue light is used to excite an LED phosphor (cf. FIG. 5 for the structure in detail), which emits longer-wave secondary light upon this excitation.

Figure 5:
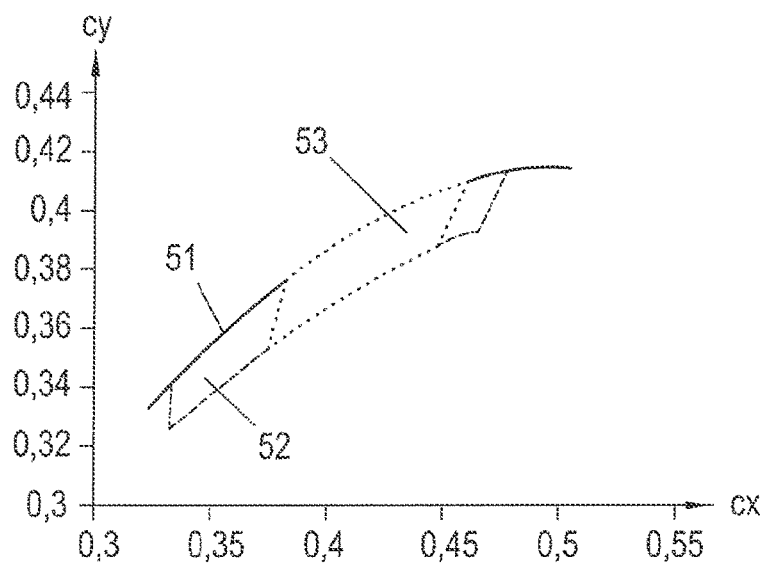
FIG. 5 is the position of preferred color points relative to the Planckian curve.

The LED phosphor excited with the blue light consists of a red phosphor and a green phosphor, the phosphors are provided in a mix (cf. FIG. 5 in detail). (Sr,Ca)AlSiN$_3$ is provided as red phosphor; the green phosphor is a nitride-orthosilicate.

The green light emitted by the green phosphor forms a green component 2 of the illumination light upon excitation with the blue LED light; the red light emitted by the red phosphor forms a red component 3 of the illumination light upon excitation with the blue LED light. In the spectral characteristic according to FIG. 1, a minimum between the green component 2 and the red component 3 is visible, i.e., in the yellow. Likewise, there is a minimum between the blue component 1 and the green component 2.

Figure 2:
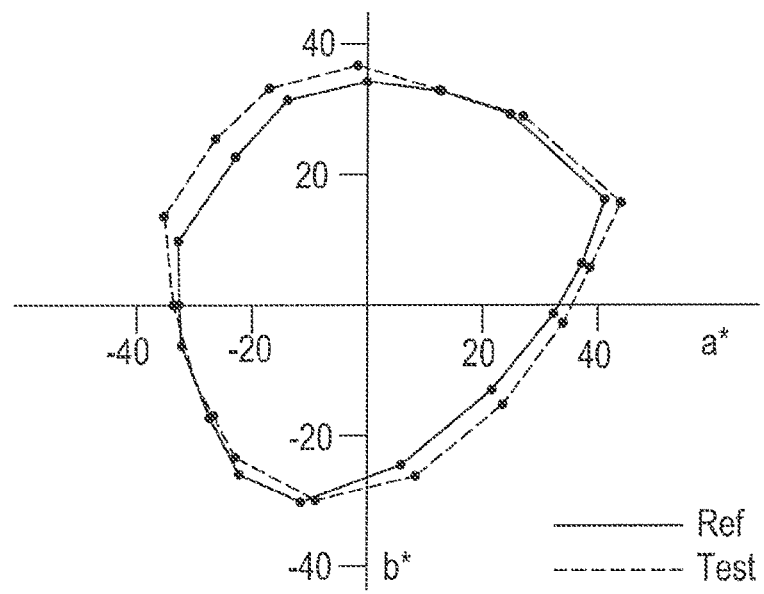
FIG. 2 is a diagram for illustration of the color saturation of the illumination light according to FIG. 1 in comparison to the light of a halogen lamp as a reference.

As illustrated in FIG. 2, this spectral characteristic of FIG. 1 divided in a way into bands can increase the color saturation, in any case in the red and green, partially also in the blue. Then again, the color saturation in the yellow is not really affected, possibly a certain red shift may occur there.

The color saturation is shown in FIG. 2 compared to the color saturation that can be achieved with a halogen lamp as a reference.

FIG. 2 shows a CIELAB diagram having the axes a* and b*. The greater the distance to the origin for a certain test color, the greater the color saturation.

An increased color saturation can be achieved with the spectral characteristic of FIG. 1. Thus, e.g., the minimum between the green component 2 and the red component 3 results in that the dyes (of the test colors), generally reflecting relatively broad-banded, are in simple terms not illuminated to the full width and accordingly are not made to reflect to the full width, which makes the test color appear less washed-out.

Figure 3:
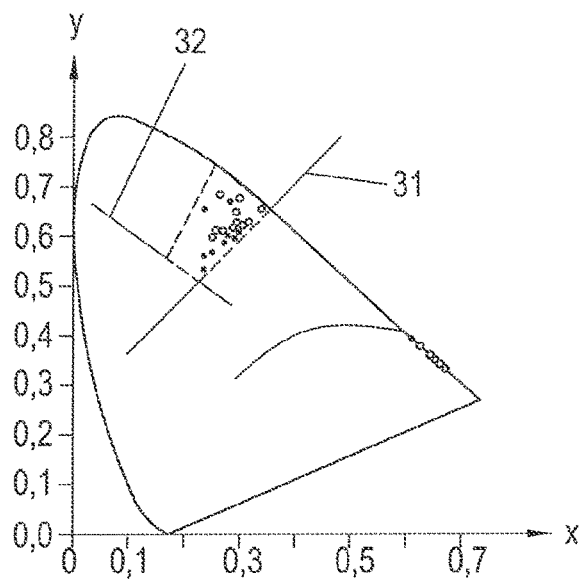
FIG. 3 is a CIE standardized chromaticity system with preferred ranges for the color points of the red and green light as part of the illumination light.

FIG. 3 shows a CIE standardized chromaticity diagram (1931) and illustrates the position of the color points of different red and green phosphors suitable for the realization of a spectral characteristic of FIG. 1. As green phosphors, an orthosilicate phosphor, a nitride-orthosilicate phosphor and a β-SiAlON phosphor were examined, wherein per phosphor in each case multiple points with a certain spectral shift to one another were simulated for consideration of technically possible deviations. All color points are in the rectangle indicated in FIG. 3.

Furthermore, two color points result per phosphor of exactly identical composition, namely depending on the measurement method, namely whether it is measured on a single grain or on a powder. On the single grain or in a significantly diluted state, a short-waved spectral extension is more intense than when measuring on a powder; this measurement, however, represents the spectral characteristic which is then also relevant in the LED (i.e., in the LED phosphor). In other words, the behavior in the LED phosphor corresponds approximately to that in the powder.

In FIG. 3, the data of the single grain measurements is identified by black dots, whereas the data determined for the relevant concentration for the LED phosphor are represented as white dots with black borders.

Even independently of the measurement method in detail, all color points plotted for the green phosphors in FIG. 3 are located within a rectangle spanned by four (x/y)-value pairs, which (x/y)-value pairs are: (0.352/0.645), (0.25/0.73), (0.17/0.55) and (0.23/0.5). The color points are also above a first straight line 31 of the form y=1.189·x+0.226 and at the same time above the second straight line 32 of the form y=−0.833·x+0.692. The dominant wavelength $\lambda_{Dom}$ of the green phosphors is between 535 nm and 550 nm, wherein the full widths at half maximum are each <80 nm.

Furthermore, also the color points for the red phosphors are indicated in the CIE standardized diagram, namely for a (Sr,Ca)AlSiN$_3$ phosphor and a 226-phosphor. The difference between measuring on the powder and the single grain is less pronounced here. The suitable red color points are all within a rectangle spanned by four (x/y)-value pairs, which (x/y)-value pairs are: (0.68/0.325), (0.61/0.39), (0.6/0.38) and (0.67/0.315). The dominant wavelengths of suitable red phosphors are between 600 nm and 618 nm, wherein the full widths at half maximum are not greater than 85 nm.

Figure 4:
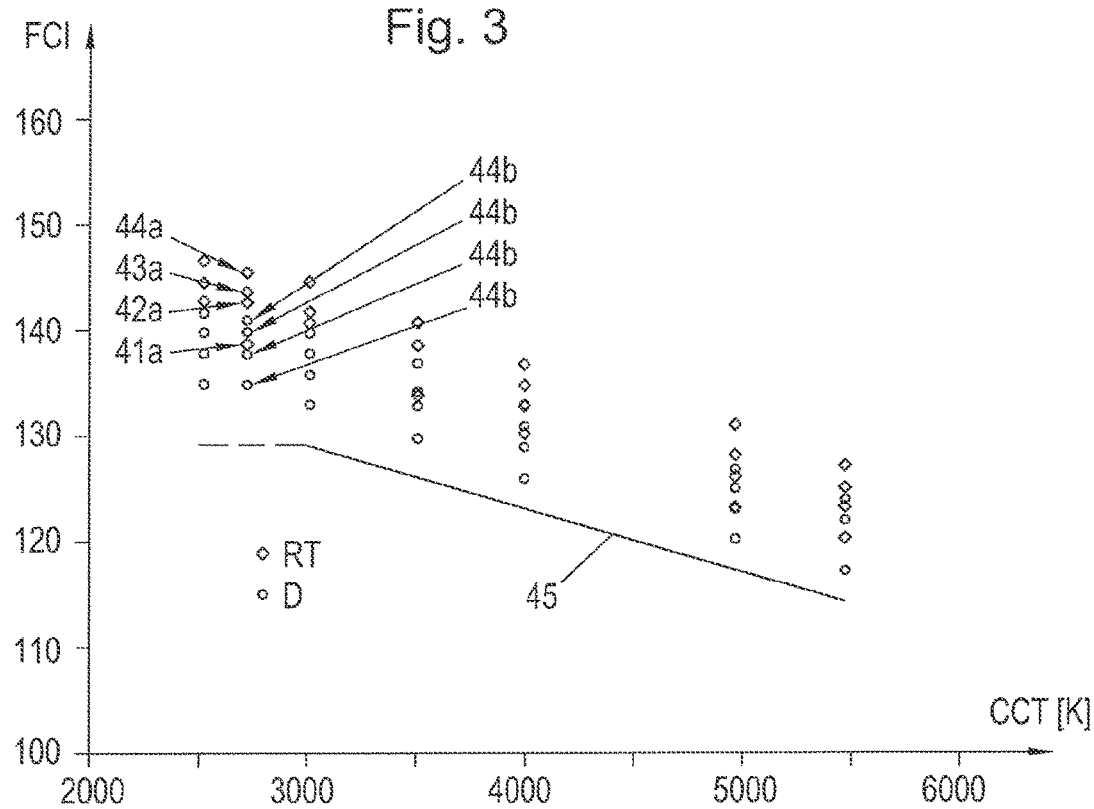
FIG. 4 is a diagram for illustration of FCI values of illuminating devices according to the invention of different color temperature.

FIG. 4 shows the respective determined FCI value in a diagram for various illuminating devices according to the invention, which value is a measure for the color saturation as well as also for the color rendering (Feeling of contrast index, FCI, cf. the description introduction regarding a reference). Two FCI values are plotted per illuminating device with a predetermined LED phosphor, i.e., a certain mixture of red and green phosphor relative to the blue component provided by the LED. Here, in each case one value corresponds to an operational temperature (of the illuminating device) of 25°, and the other one corresponds to an operational temperature of 90°. The results were determined by a simulation.

Here, the inventors also examined multiple illuminating devices per color temperature, which differ in the distance of their respective color point from the Planckian curve. Per color temperature, the color points are located on a Judd straight line. Four illuminating devices differing in their color point 41 were examined per such straight line and thus per color temperature, wherein the first color point is located in each case (per color temperature) three MacAdams steps above the Planckian curve, the second color point 42 is located three MacAdams steps below the Planckian curve, the third color point 43 is located six MacAdams steps and the fourth color point 44 ten MacAdams steps below the Planckian curve. Thus, the FCI value is (with the same color temperature) greater for values below the Planckian curve than above this curve.

The reference characters a, b discriminate between the room temperature (25° C.) as operational condition (RT) and the increased temperature of 90° C., which arises in permanent operation (D) then. Comparison of, e.g., 44a and 44b thus relates the same illuminating device at different temperatures, the FCI value decreases as the temperature increases (which is usually due to the properties of the phosphors, the emission wavelength of which can slightly change with temperature).

With color temperatures <3000 K, the FCI values are all >130. With higher color temperatures (of at least 3000 K), the FCI values are above a straight line 45 of the form FCI=−0.006·T(K)+148.

By means of FIG. 4, it became clear that a color point located at a certain distance to the Planckian curve with the desired color temperature can even be preferred over a position on the Planckian curve, because the FCI value can be increased in this way.

FIG. 5 shows a Planckian curve 51 in a coordinate system, which suits to a CIE standard chromaticity diagram, though the color space is not shown for the sake of clarity.

A first greater range 52 is indicated below the Planckian curve 51, in which the color point of the illumination light of an illuminating device according to the invention shall preferably be located. Particularly preferably, the color point shall be in the second narrower range 53, which is included by the first range 52.

Figure 6:
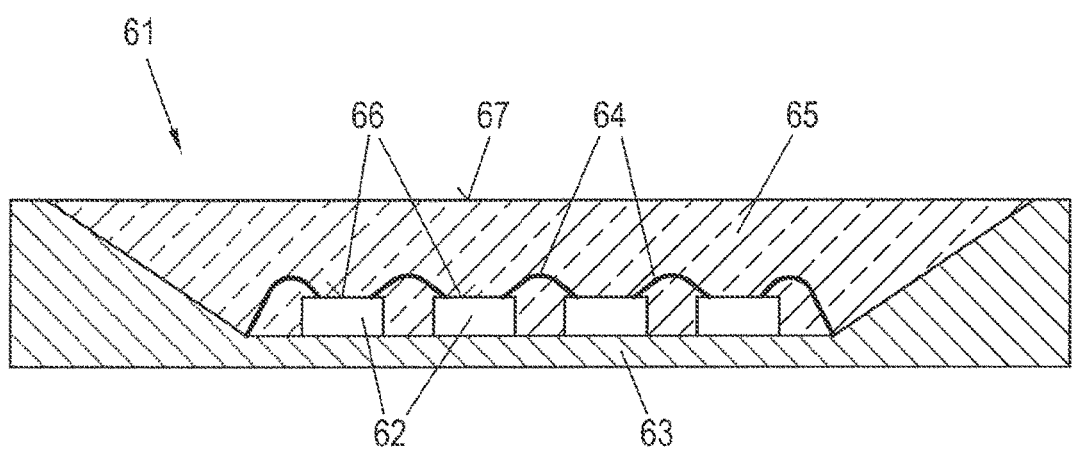
FIG. 6 is an illuminating device according to the invention in a schematic sectional view.

FIG. 6 shows a schematic sectional view through an illuminating device 61 according to the invention comprising multiple LEDs 62, namely per se un-housed LED chips. These are arranged on a substrate 63 and connected to one another and to leadframe connectors (not shown) of the substrate 63 via bonding wires 64.

The LED chips are housed together in the illuminating device 61, namely covered with a casting material 65, namely silicone. A mix of the red and green phosphor is embedded in the silicone. A plurality of phosphor particles is embedded in the casting material 65 and randomly distributed therein.

The blue light (as primary radiation) emitted by the LEDs 62 in each case at a light radiation surface 66 penetrates the casting material 65 with the phosphor mixture and is partially converted in this process. At a light radiation surface 67 of the illuminating device 61, a mixture of the conversion light output by the LED phosphor (the mixture) upon this excitement and a non-converted part of the blue LED light is output as illumination light.

The invention claimed is:

1. A semiconductor illuminating device for emitting illumination light comprising:
    an LED configured for emitting blue primary radiation; and
    an LED phosphor arranged and configured such that it emits secondary light that forms at least one component of the illumination light,
    wherein the LED phosphor comprises a red phosphor for emitting red light as a component of the secondary light and a green phosphor for emitting green light as a component of the secondary light, wherein the green light has a color point located above a first straight line having a slope m1 and a y-intercept n1 in a CIE standard chromaticity diagram, with the slope m1=1.189 and the y-intercept n1=0.226, and
    wherein the components of the illumination light are at such a ratio to one another that the illumination light has a color temperature of at most 5500 K.

2. The semiconductor illuminating device according to claim 1, wherein the illumination light has a color point which, in the CIE standard chromaticity diagram, is in a range that limits the Planckian curve upward and which extends downward to a distance of 15 threshold value units from the Planckian curve.

3. The semiconductor illuminating device according to claim 1, wherein the green light has a color point which, in the CIE standard chromaticity diagram, is located above a second straight line having a slope m2 and a y-intercept n2, and wherein the slope m2=−0.833 and the y-intercept n2=0.692.

4. The semiconductor illuminating device according to claim 3, wherein the color point of the green light, in the CIE standard chromaticity diagram, is located in a rectangle spanned by four (x/y)-value pairs, and wherein the (x/y)-value pairs are: (0.352/0.645), (0.25/0.73), (0.17/0.55) and (0.23/0.5).

5. The semiconductor illuminating device according claim 1, wherein the green light has a dominant wavelength $\lambda$Dom of at least 515 nm and at most 555 nm with a full width at half maximum of at most 85 nm.

6. The semiconductor illuminating device according to claim 1, wherein the color point of the red light, in the CIE standard chromaticity diagram, is located in a rectangle spanned by four (x/y)-value pairs, and wherein the (x/y)-value pairs are: (0.68/0.325), (0.61/0.39), (0.6/0.38) and (0.67/0.315).

7. The semiconductor illuminating device according to claim 1, wherein the red light has a peak wavelength $\lambda$peak of at least 630 nm and at most 645 nm with a full width at half maximum of at most 100 nm.

8. The semiconductor illuminating device according to claim 1, wherein the illumination light has a color rendering index of at least 80.

9. The semiconductor illuminating device according to claim 1, wherein the green phosphor comprises an ortho-silicate phosphor, a nitride-orthosilicate phosphor and/or a β-SiAlON phosphor.

10. The semiconductor illuminating device according to claim 1, wherein the primary radiation emitted by the LED is blue light, which forms a component of the illumination light.

11. The semiconductor illuminating device according to claim 1, further comprising a plurality of LEDs configured to emit blue primary radiation, wherein each LED is installed in the semiconductor illuminating device as an LED chip, and wherein the LEDs are housed together with a filler material.

12. The semiconductor illuminating device according to claim 1, wherein the illumination light has an FCI value of at least 130 when the color temperature is less than 3000 K, and has an FCI value located above a straight line FCI=mFCI·T+nFCI having a slope mFCI and an y-intercept nFCI, with the color temperature plotted on the x-axis, wherein mFCI=−0.006 and nFCI=148 when the color temperature is at least 3000 K.

13. The semiconductor illuminating device according to claim 1, wherein the molecular formula for the green phosphor is $AE_{2-x}L_xSiO_{4-x}N_x$:RE and/or $AE_{2-x}L_xSi_{1-y}O_{4-x-2y}N_x$:RE and/or $AE_2SiO_4$:RE, wherein AE contains one or more elements selected from Mg, Ca, Sr, or Ba, wherein RE contains at least Eu, and wherein L contains one or more element(s) selected from rare earth metals different from RE, with $0<x\leq0.1$, and $0<y\leq0.1$.

14. A lighting device comprising:
a semiconductor illuminating device according to claim 1; and
a base to which the semiconductor illuminating device is electrically connected,
wherein the base is an Edison screw base, a shell base, a tube base or a bayonet base.

15. A semiconductor illuminating device for emitting illumination light comprising:
a LED configured to emit blue primary radiation; and
a LED phosphor arranged and configured to emit secondary light that forms at least one component of the illumination light,
wherein the LED phosphor comprises a red phosphor for emitting red light as a component of the secondary light and a green phosphor for emitting green light as a component of the secondary light, wherein the green light has a color point located above a first straight line having a slope m1 and a y-intercept n1 in a CIE standard chromaticity diagram, with the slope m1=1.189 and the y-intercept n1=0.226,
wherein components of the illumination light are at such a ratio to one another that the illumination light has a color temperature of at most 5500 K, and
wherein the red light has a peak wavelength $\Lambda_{peak}$ of at least 630 nm and at most 645 nm with a full width at half maximum of at most 100 nm.

16. A lighting device comprising:
a semiconductor illuminating device according to claim 1; and
a base to which the semiconductor illuminating device is electrically connected,
wherein the base is a plug base.

17. A lighting device comprising:
a semiconductor illuminating device according to claim 1; and
a base to which the semiconductor illuminating device is electrically connected,
wherein the base is a pin base.

18. A lighting device comprising:
a semiconductor illuminating device according to claim 1; and
a base to which the semiconductor illuminating device is electrically connected,
wherein the base is a screw base.

* * * * *